United States Patent
Bi et al.

(10) Patent No.: US 10,734,245 B2
(45) Date of Patent: Aug. 4, 2020

(54) HIGHLY SELECTIVE DRY ETCH PROCESS FOR VERTICAL FET STI RECESS

(71) Applicant: International Business Machines Corporation, Armonk, NY (US)

(72) Inventors: Zhenxing Bi, Niskayuna, NY (US); Muthumanickam Sankarapandian, Niskayuna, NY (US); Richard A. Conti, Altamont, NY (US); Michael P. Belyansky, Halfmoon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/165,786

(22) Filed: Oct. 19, 2018

(65) Prior Publication Data

US 2020/0126805 A1    Apr. 23, 2020

(51) Int. Cl.
| | |
|---|---|
| *H01L 21/311* | (2006.01) |
| *H01L 21/762* | (2006.01) |
| *H01L 29/66* | (2006.01) |
| *H01L 29/78* | (2006.01) |
| *H01L 21/768* | (2006.01) |
| *H01L 21/02* | (2006.01) |

(52) U.S. Cl.
CPC .. *H01L 21/31116* (2013.01); *H01L 21/02318* (2013.01); *H01L 21/02334* (2013.01); *H01L 21/02337* (2013.01); *H01L 21/02356* (2013.01); *H01L 21/76224* (2013.01); *H01L 21/76828* (2013.01); *H01L 29/66666* (2013.01); *H01L 29/7827* (2013.01)

(58) Field of Classification Search
CPC ......... H01L 21/31116; H01L 21/76828; H01L 21/02318; H01L 21/02337; H01L 21/02356; H01L 21/02334; H01L 29/66666; H01L 29/7837
See application file for complete search history.

(56) References Cited

U.S. PATENT DOCUMENTS

| | | | |
|---|---|---|---|
| 5,635,102 A | 6/1997 | Mehta | |
| 6,197,641 B1 * | 3/2001 | Hergenrother | ........ H01L 29/161 257/E21.41 |
| 6,849,193 B2 | 2/2005 | Hung et al. | |
| 8,226,840 B2 | 7/2012 | Sinha | |
| 8,815,668 B2 | 8/2014 | Basker et al. | |

(Continued)

OTHER PUBLICATIONS

Fang et al., "SAQP Pitch walk metrology using single target metrology," Proc. of SPIE, vol. 10145 (Mar. 2017) (7 total pages).

(Continued)

*Primary Examiner* — Victoria K. Hall
(74) *Attorney, Agent, or Firm* — Vazken Alexanian; Michael J. Chang, LLC

(57) ABSTRACT

Highly selective dry etching techniques for VFET STI recess are provided. In one aspect, a method for dry etching includes: contacting a wafer including an oxide with at least one etch gas under conditions sufficient to etch the oxide at a rate of less than about 30 Å/min; removing a byproduct of the etch from the wafer using a thermal treatment; and repeating the contacting step followed by the removing step multiple times until a desired recess of the oxide has been achieved. A method of forming a VFET device is also provided.

18 Claims, 10 Drawing Sheets

(56) References Cited

U.S. PATENT DOCUMENTS

| | | |
|---|---|---|
| 8,829,617 B2 | 9/2014 | Haran et al. |
| 9,123,654 B2 | 9/2015 | Leobandung |
| 9,171,935 B2* | 10/2015 | Kim ................. H01L 21/31116 |
| 9,209,178 B2* | 12/2015 | Kanakasabapathy ....................... H01L 27/0886 |
| 9,224,840 B2 | 12/2015 | Flachowsky et al. |
| 9,553,012 B2 | 1/2017 | Lee et al. |
| 9,646,848 B2* | 5/2017 | Toda ................. H01L 21/31116 |
| 9,716,170 B1* | 7/2017 | Cheng ................. H01L 29/7827 |
| 9,721,845 B1* | 8/2017 | Cheng ............ H01L 21/823487 |
| 9,728,635 B1* | 8/2017 | Cheng ................. H01L 29/7827 |
| 9,748,380 B1* | 8/2017 | Lie ....................... H01L 29/7827 |
| 9,748,381 B1* | 8/2017 | Bi ....................... H01L 29/7827 |
| 9,755,073 B1* | 9/2017 | Cheng ................. H01L 29/7843 |
| 9,768,072 B1* | 9/2017 | Cheng ............ H01L 21/823487 |
| 10,096,524 B1* | 10/2018 | Bi ................... H01L 21/823807 |
| 10,242,882 B2* | 3/2019 | Bi ..................... H01L 21/31116 |
| 10,366,928 B2* | 7/2019 | Bi ....................... H01L 29/0649 |
| 10,535,550 B2* | 1/2020 | Belyansky ........ H01L 29/66818 |
| 2006/0057802 A1 | 3/2006 | Nowak et al. |
| 2008/0197110 A1* | 8/2008 | Kim ........................... C23F 4/00 216/67 |
| 2008/0206900 A1* | 8/2008 | Kim ................. H01L 21/31116 438/9 |
| 2008/0206901 A1* | 8/2008 | Kim ..................... H01L 21/3065 438/9 |
| 2009/0101626 A1* | 4/2009 | Arndt ..................... C09K 13/04 216/84 |
| 2014/0015055 A1 | 1/2014 | Flachowsky et al. |
| 2014/0193963 A1* | 7/2014 | Godet ............... H01L 21/02321 438/424 |
| 2014/0231913 A1 | 8/2014 | Leobandung |
| 2014/0308818 A1 | 10/2014 | Wang et al. |
| 2016/0005621 A1* | 1/2016 | Toda ................. H01L 21/31116 438/734 |
| 2016/0155670 A1* | 6/2016 | Liaw ............... H01L 21/823431 257/401 |
| 2017/0004975 A1* | 1/2017 | Farmer ............. H01L 29/66795 |
| 2017/0125286 A1* | 5/2017 | Briggs ............. H01L 21/31055 |
| 2017/0213900 A1* | 7/2017 | Cheng ............... H01L 21/28079 |
| 2017/0352541 A1* | 12/2017 | Hsu .................... H01L 21/02636 |
| 2018/0053844 A1 | 2/2018 | Bi et al. |
| 2018/0090367 A1* | 3/2018 | Bi ....................... H01L 29/0649 |
| 2018/0096992 A1 | 4/2018 | Bi et al. |
| 2018/0226291 A1 | 8/2018 | Hsu et al. |
| 2018/0233500 A1 | 8/2018 | Cheng |
| 2018/0358232 A1* | 12/2018 | Bi ..................... H01L 21/31116 |
| 2019/0067078 A1* | 2/2019 | Belyansky ............ H01L 21/762 |
| 2019/0067079 A1* | 2/2019 | Belyansky ............ H01L 21/762 |

OTHER PUBLICATIONS

W. Natzle et al., "Trimming of hard-masks by Gaseous Chemical Oxide Removal (COR) for sub-10nm gates/fins, for gate length control and for embedded logic," IEEE/SEMI Advanced Semiconductor Manufacturing Conference, pp. 61-65 (May 2004).

* cited by examiner

HIGHLY SELECTIVE DRY ETCH PROCESS FOR VERTICAL FET STI RECESS

FIELD OF THE INVENTION

The present invention relates to etching techniques, and more particularly, to highly selective dry etching techniques for vertical field effect transistor (VFET) shallow trench isolation (STI) recess.

BACKGROUND OF THE INVENTION

Conventional complementary metal oxide semiconductor (CMOS) process flows typically employ reactive ion etching (RIE) or a wet chemical etch for shallow trench isolation (STI) recess. However, with advanced non-planar technologies such as vertical field effect transistor (VFET) devices, STI recess can rarely be conducted by RIE or a wet chemical etch due to the poor etch selectivity (hardmask erosion) and/or etch loading effects. Etch loading effects refer to the etch rate dependence on a quantity of material being removed. With iso-dense loading, etch loading effects can undesirably lead to etch non-uniformity across a chip.

Thus, in order to compensate the etch loading effect, the current VFET process flow employs buffered hydrofluoric acid (BHF) plus chemical oxide removal (COR) for STI recess. Namely, with BHF the dense areas etch faster and the isolated areas etch slower. Conversely, with COR the dense areas etch slower and the isolated areas etch faster.

The current COR process, however, does not provide good etch selectivity to hardmask materials such as silicon nitride (SiN). Thus, the COR budget is limited in order to avoid aggressive hardmask erosion.

Accordingly, improved techniques for STI recess on VFET devices would be desirable.

SUMMARY OF THE INVENTION

The present invention provides highly selective dry etching techniques for vertical field effect transistor (VFET) shallow trench isolation (STI) recess. In one aspect of the invention, a method for dry etching is provided. The method includes: contacting a wafer including an oxide with at least one etch gas under conditions sufficient to etch the oxide at a rate of less than about 30 angstroms (Å) per minute (min) (Å/min); removing a byproduct of the etch from the wafer using a thermal treatment; and repeating the contacting step followed by the removing step multiple times until a desired recess of the oxide has been achieved.

In another aspect of the invention, a method of forming a VFET device is provided. The method includes: etching fins in a wafer using fin hardmasks, wherein the fins include vertical fin channels of the VFET device; patterning at least one shallow trench isolation (STI) trench in the wafer adjacent to the fins; burying the fins in an STI oxide; recessing the STI oxide by i) contacting the wafer with at least one etch gas under conditions sufficient to etch the oxide at a rate of less than about 30 Å/min, ii) removing a byproduct of the etch from the wafer using a thermal treatment, and iii) repeating the contacting step followed by the removing step multiple times until a desired recess of the STI oxide has been achieved; forming bottom source and drains in the wafer at a base of the fins; forming bottom spacers on the bottom source and drains; forming gates around the fins above the bottom spacers; forming top spacers over the gates; and forming top source and drains at tops of the fins.

A more complete understanding of the present invention, as well as further features and advantages of the present invention, will be obtained by reference to the following detailed description and drawings.

DETAILED DESCRIPTION OF PREFERRED EMBODIMENTS

Provided herein are highly selective dry etching techniques for vertical field effect transistor (VFET) shallow trench isolation (STI) recess. As will be described in detail below, the present techniques employ a cyclic process with multiple etch and thermal treatment steps for VFET STI recess. The present process has an ultra-low etch rate due to its very diluted reaction gas and low etch chamber pressure which extends the incubation time of silicon nitride (SiN) hardmask etch thus improving the SiO:SiN etch selectivity during STI recess.

Figure 1:
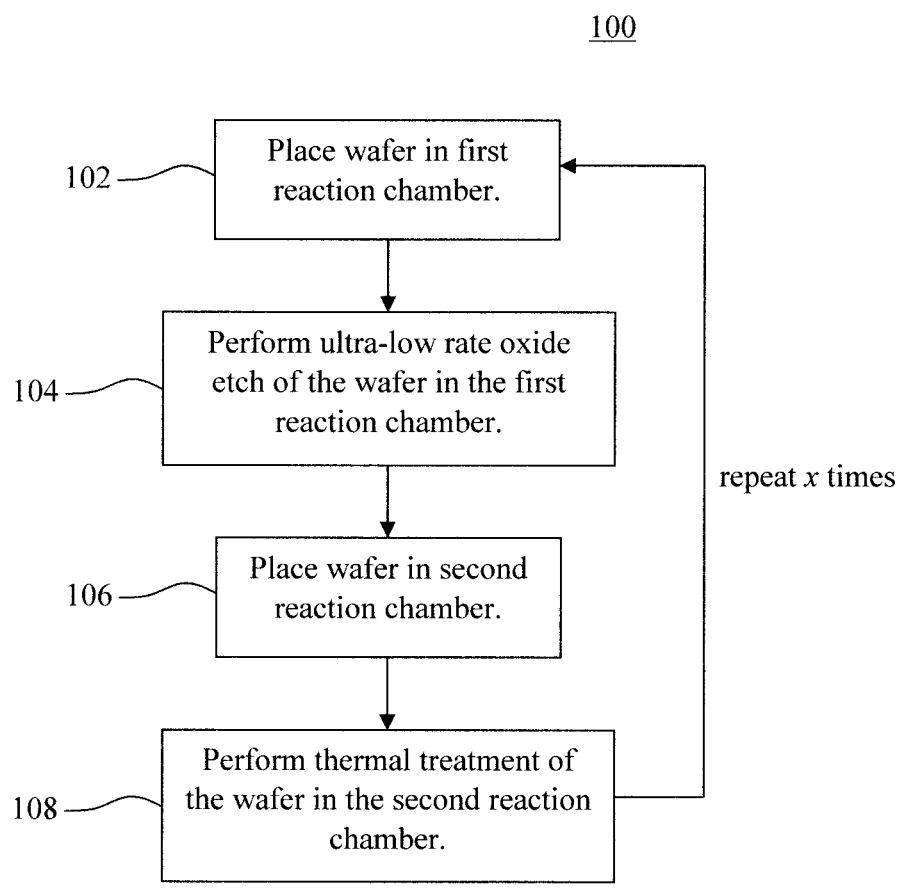
FIG. 1 is a diagram illustrating an exemplary methodology for ultra-low etch rate dry etching according to an embodiment of the present invention.

An overview of the present ultra-low etch rate dry etching process is now provided by way of reference to methodology 100 of FIG. 1. According to an exemplary embodiment, methodology 100 is performed to recess an STI oxide (e.g., silicon oxide (SiOx)) on a device wafer in conjunction with the fabrication of a VFET device on the wafer. Further, as will be described in detail below, the fabrication of a VFET device includes the use of fin hardmasks (e.g., formed of a nitride hardmask material such as silicon nitride (SiN)) to pattern vertical fin channels. Since the STI and STI recess occurs after fin patterning, a plurality of fins and fin hardmasks are also present on the wafer. According to an exemplary embodiment, methodology 100 is carried out in one or more reaction chambers or other vessels in which the chamber pressure is controlled.

In step 102, the wafer is placed in a first reaction chamber. In step 104, in the first reaction chamber, the wafer is contacted with at least one etch gas in a carrier gas under conditions sufficient to produce an ultra-low rate etch of the STI oxide. The term "ultra-low rate etch." as used herein refers to an etch rate of less than about 30 angstroms (Å) per minute (min) (Å/min), e.g., from about 20 Å/min to about 25 Å/min and ranges therebetween.

Suitable etch gases include, but are not limited to, ammonia ($NH_3$) gas and/or hydrogen fluoride (HF) gas. According to an exemplary embodiment, a mixture of $NH_3$ and HF is employed in a ratio of from about 1:1 to about 1:2. Suitable carrier gases include, but are not limited to, argon (Ar) gas and/or nitrogen ($N_2$) gas.

By way of example only, the etching conditions can include a chamber pressure of from about 30 millitorr (mTorr) to about 50 mTorr and ranges therebetween, a temperature of from about 30° C. to about 50° C. and ranges therebetween, a duration of from about 50 seconds to about 1000 seconds and ranges therebetween, and a dilute amount of the etch gas, e.g., from about 30 standard cubic centimeters per minute (sccm) to about 50 sccm and ranges therebetween of the etch gas in from about 400 sccm to about 1000 sccm and ranges therebetween of the carrier gas. For instance, when the etch gas includes a mixture of $NH_3$ and HF, the flow of $NH_3$ and HF in the first chamber is from about 30 sccm to about 50 sccm and ranges therebetween. As is known in the art, standard cubic centimeters per minute (or sccm) is a flow measurement that indicates an amount (i.e., volume) of gas that passes through a given section per unit time.

When the wafer is contacted with the etch gases/carrier gas under these conditions an ultra-low etch rate of less than about 30 Å/min (e.g., from about 20 Å/min to about 25 Å/min and ranges therebetween) is achieved. Further, the incubation time of SiN etch is elongated, thus improving the SiOx (STI):SiN (fin hardmask) etch selectivity during the STI recess.

The details of the etch process that occurs during step 104 are now described. When contacted with the wafer, the etch gases (e.g., $NH_3$ and HF) are absorbed onto the wafer surface, where a surface etch of the STI oxide occurs. A solid byproduct of the oxide etch (e.g., $(NH_4)_2SiF_6$— see below) is formed on the oxide surface. However, the etch gases can readily diffuse into the solid byproduct and reach the underlying oxide for etching. The etch reaction with $NH_3$ and HF occurs as follows:

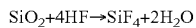

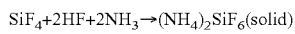

In step 106, the wafer is transferred to a second reaction chamber. In step 108, in the second reaction chamber, a thermal treatment of the wafer is carried out in the presence of an inert gas under conditions sufficient to remove (by evaporation) the solid byproduct (e.g., $(NH_4)_2SiF_6$) of the etch reaction. Suitable inert gases include, but are not limited to, $N_2$ gas and/or Ar gas. By way of example only, the thermal treatment conditions can include a chamber pressure of from about 500 mTorr to about 1000 mTorr and ranges therebetween, a temperature of from about 150° C. to about 200° C. and ranges therebetween, a duration of from about 1 minute to about 5 minutes and ranges therebetween, and a flow of the inert gas of from about 1000 sccm to about 2000 sccm and ranges therebetween.

For example, once placed in the second reaction chamber, the wafer is heated, e.g., to a temperature of from about 150° C. to about 200° C. and ranges therebetween, to evaporate the byproduct by converting the byproduct to a gas that is then removed via the inert gas (e.g., $N_2$) flow through the second reaction chamber. The thermal treatment process occurs as follows:

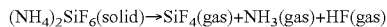

As shown in FIG. 1, the process is cyclic. Namely, the etch (in the first reaction chamber) and thermal treatment (in the second reaction chamber) steps are repeated multiple times x. Through this cyclic process, at each iteration the ultra-low rate etch is performed, followed by a thermal treatment to remove the byproduct by evaporation. The process is then repeated until the desired recess depth of the STI oxide has been achieved.

Figure 2:
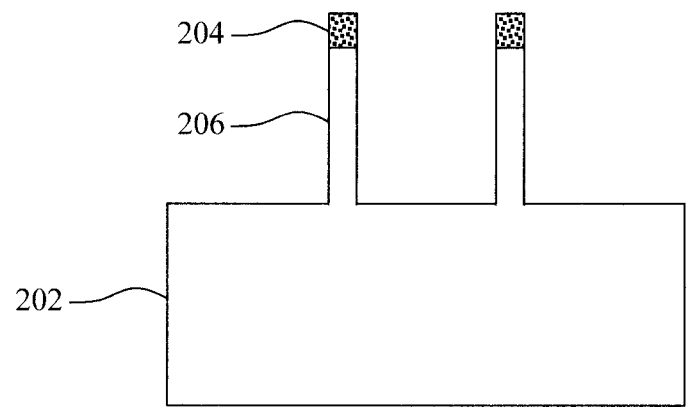
FIG. 2 is a cross-sectional diagram illustrating fin hardmasks having been used to etch fins in a wafer according to an embodiment of the present invention.
Figure 3:
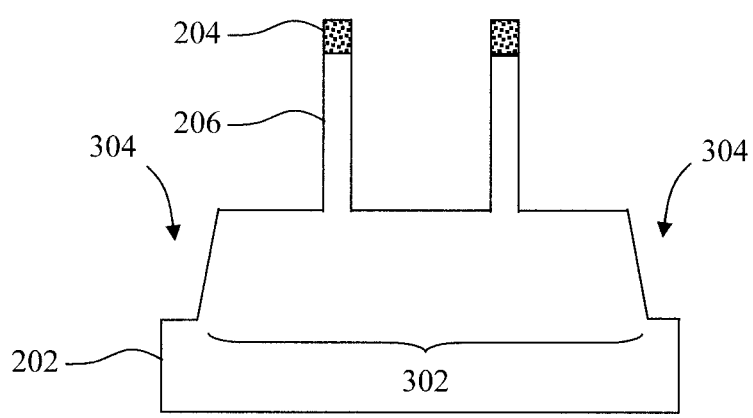
FIG. 3 is a cross-sectional diagram illustrating shallow trench isolation (STI) trenches having been patterned in the wafer adjacent to the fins according to an embodiment of the present invention.
Figure 4:
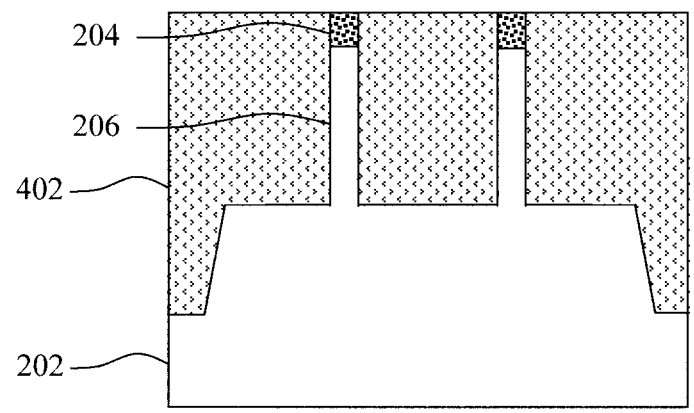
FIG. 4 is a cross-sectional diagram illustrating the fins having been buried in an STI oxide, which fills the STI trenches according to an embodiment of the present invention.
Figure 5:
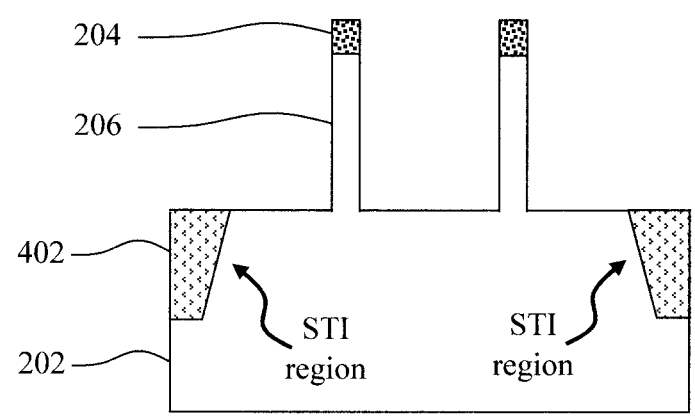
FIG. 5 is a cross-sectional diagram illustrating the STI oxide having been recessed using the dry etching process of FIG. 1 according to an embodiment of the present invention.

Given the above overview, an exemplary embodiment for forming a VFET device employing the present ultra-low rate oxide etch process is now described by way of reference to FIGS. 2-17. As shown in FIG. 2, the process begins with a wafer 202.

According to one exemplary embodiment, the starting wafer 202 is a bulk semiconductor wafer, such as a bulk silicon (Si), bulk germanium (Ge) and/or bulk silicon germanium (SiGe) wafer. Alternatively, wafer 202 can be a semiconductor-on-insulator (SOI) wafer. A SOI wafer includes an SOI layer separated from an underlying substrate by a buried insulator. When the buried insulator is an oxide it is referred to as a buried oxide or BOX. The SOI layer can include any suitable semiconductor, such as Si, Ge and/or SiGe.

Fin hardmasks 204 are then formed on the wafer 202. The fin hardmasks 204 mark the footprint and location of one or more vertical fin channels. A variety of different techniques are contemplated herein for forming the fin hardmasks 204 on the wafer 202. According to one exemplary embodiment, a direct patterning approach is employed whereby a hardmask material is blanket deposited onto the wafer 202. Standard lithography and etching techniques are then used to pattern the hardmask material into the individual fin hardmasks 204 shown in FIG. 2. Suitable hardmask materials include, but are not limited to, nitride hardmask materials, such as silicon nitride (SiN) and/or silicon oxycarbonitride (SiOCN).

Alternatively, an approach such as sidewall image transfer (SIT) can be employed to form the fin hardmasks 204. A suitable SIT process that may be used in accordance with the present techniques is described, for example, in U.S. Pat. No. 9,123,654 issued to Effendi Leobandung, entitled "Trilayer SIT Process with Transfer Layer for FINFET Patterning," the contents of which are incorporated by reference as if fully set forth herein. SIT, also sometimes referred to as self-aligned double patterning (SADP), involves the use of mandrels to place sidewall spacers. The mandrels are removed selective to the sidewall spacers, which are then used to pattern the hardmask. The SIT process is a pitch doubling technique, since for each (patterned) mandrel there will be two resulting spacers/hardmasks. Thus, SIT can be used to pattern fins at a sub-lithographic pitch, i.e., a pitch smaller than what is achievable using direct lithographic patterning. A process wherein the SIT steps are repeated is referred to as self-aligned quadruple patterning (SAQP). The SAQP process is described, for example, in Fang et al., "SAQP Pitch walk metrology using single target metrology," Proc. of SPIE, vol. 10145 (March 2017) (7 total pages), the contents of which are incorporated by reference as if fully set forth herein.

The fin hardmasks 204 are then used to etch fins 206 in the wafer 202. An anisotropic etching process such as reactive ion etching (RIE) can be employed for the fin etch. As shown in FIG. 1, the fins 206 extend only partway through the wafer 202.

An STI process is then used to form STI regions in the wafer 202 adjacent to the fins 206 that isolate an active region 302 of the wafer 202 containing the fins 206. See FIG. 3. To do so, standard lithography and etching techniques are first used to pattern STI trenches 304 in the wafer 202 adjacent to the fins 206.

The fins 206 are then buried in an STI oxide 402, which fills the STI trenches 304. See FIG. 4. Suitable STI oxide materials include, but are not limited to, silicon oxide (SiOx). A process such as chemical mechanical polishing (CMP) is then used to polish the deposited STI oxide 402 down to the fin hardmasks 204.

The STI oxide 402 is then recessed using the dry etching process described in conjunction with the description of FIG. 1 above. See FIG. 5. As described above, the present etching techniques involve a cyclic process with multiple etch and thermal treatment steps, and has an ultra-low etch rate (for example, less than about 30 Å/min, e.g., from about 20 Å/min to about 25 A/min and ranges therebetween) due to its very diluted reaction gas and low etch chamber pressure. Advantageously, this ultra-low etch rate extends the selectivity for etching oxide over nitride, which is important to preserve the integrity of the fin hardmasks 204 (e.g., SiN and/or SiOCN) during the STI oxide 402 recess.

Figure 6:
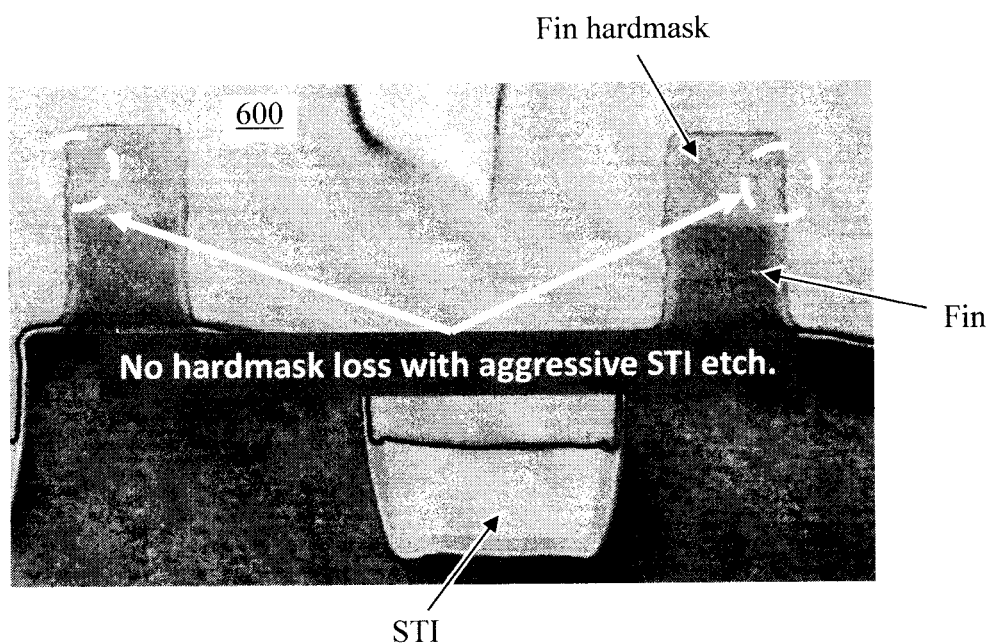
FIG. 6 is an image of a sample prepared using the present ultra-low etch rate process for STI recess having no hardmask loss according to an embodiment of the present invention.
Figure 7:
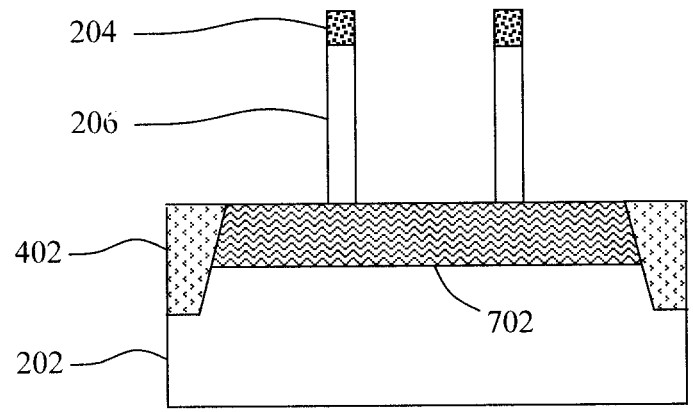
FIG. 7 is a cross-sectional diagram illustrating bottom source and drains having been formed in the wafer at the base of the fins according to an embodiment of the present invention.
Figure 8:
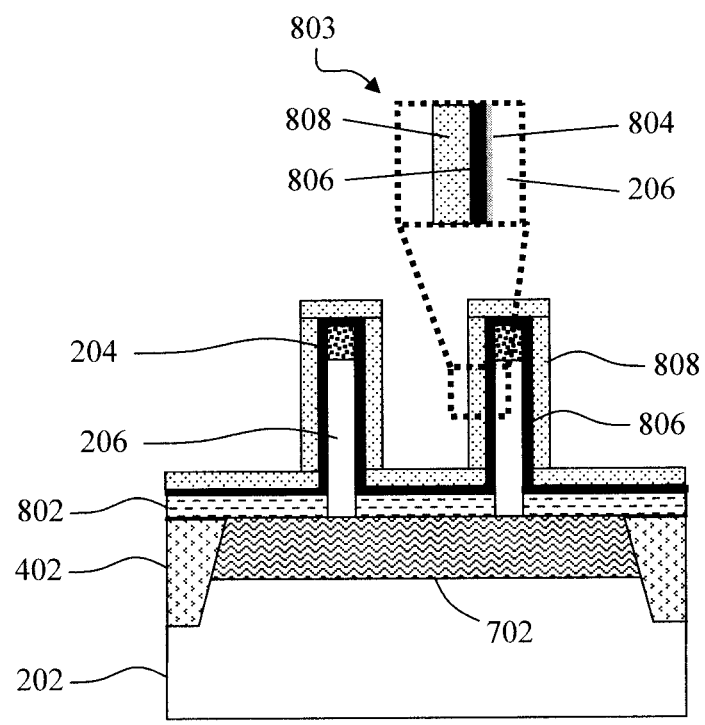
FIG. 8 is a cross-sectional diagram illustrating bottom spacers having been formed on the bottom source and drains, and gates having been formed around the fins (vertical fin channels) above the bottom spacers according to an embodiment of the present invention.

Namely, referring to FIG. 6, an image 600 is provided of a sample prepared using the present cyclic, ultra-low etch rate process for STI recess. As shown in image 600, no hardmask loss is present, even with an aggressive STI etch.

Bottom source and drains 702 are then formed in the wafer 202 at the base of the fins 206. See FIG. 7. According to an exemplary embodiment, the bottom source and drains 702 are formed using ion implantation into the wafer 202, beneath the fins 206. Suitable n-type dopants include, but are not limited to, phosphorous (P) and/or arsenic (As), and suitable p-type dopants include, but are not limited to, boron (B). Alternatively, the bottom source and drains 702 can be formed from a doped epitaxial material that is grown on the wafer 202 at the base of the fins 206 and in between the fins 206. Suitable epitaxial materials for the bottom source and drains 702 include, but are not limited to, epitaxial Si, epitaxial Ge and/or epitaxial SiGe that is in-situ doped (i.e., during growth) or ex-situ doped (e.g., via a process such ion implantation) with the p-type or n-type dopants provided above.

Bottom spacers 802 are next formed on the bottom source and drains 702, in between the fins 206. According to an exemplary embodiment, the bottom spacers 802 are formed using a directional deposition process whereby a spacer material is deposited onto the bottom source and drains 702 and fins 206 with a greater amount of the material being deposited on the horizontal surfaces, as compared to the vertical surfaces. To use an illustrative example, a greater thickness of the spacer material will be deposited on top of the bottom source and drains 702 in between the fins 206 than along the sidewalls of the fins 206. Thus, when an etch is used on the spacer material, the timing of the etch needed to remove the spacer material from the vertical surfaces will leave the bottom spacers 802 shown in FIG. 8 on top of bottom source and drains 702 since a greater amount of the spacer material was present on the bottom source and drains 702 to begin with.

By way of example only, a high-density plasma (HDP) chemical vapor deposition (CVD) or physical vapor deposition (PVD) process can be used for directional film deposition, and an isotropic etch can be used to remove the (thinner) spacer material deposited onto the vertical surfaces. Suitable materials for the bottom spacers 802 include, but are not limited to, oxide spacer materials such as silicon dioxide ($SiO_2$) and/or silicon carbon oxide (SiCO), and nitride spacer materials such as silicon nitride (SiN), silicon boron carbon nitride (SiBCN), silicon oxycarbon nitride (SiOCN), and/or silicon carbon nitride (SiCN).

Gates are then formed around the fins 206 (vertical fin channels) above the bottom spacers 802. According to an exemplary embodiment, the gates include a conformal gate dielectric 806 that is deposited onto the fins 206, and a conformal gate conductor 808 that is deposited onto the gate dielectric 806. Prior to forming the gates, an interfacial oxide 804 (e.g., $SiO_2$ which may include other chemical elements in it such as nitrogen, germanium, etc.) is first formed selectively on exposed surfaces of the fins 206 by an oxidation process to a thickness of from about 0.3 nm to about 5 nm, and ranges therebetween, e.g., about 1 nm. See magnified view 803.

Suitable gate conductors include, but are not limited to, doped polycrystalline or amorphous silicon (Si), germanium (Ge), silicon germanium (SiGe), a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), and/or gold (Au)), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), and/or nickel silicide (NiSi)), transition metal aluminides (e.g. $Ti_3Al$ and/or ZrAl), TaC, TaMgC, carbon nanotubes, conductive carbon and/or graphene. The gate conductor can further include dopants that are incorporated during or after deposition. In some embodiments, the gate may further include a workfunction setting layer between the gate dielectric and gate conductor. The workfunction setting layer can be a workfunction metal. The workfunction metal can be any suitable material, including but not limited a nitride (e.g., titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN) and/or niobium nitride (NbN)) and/or a carbide (e.g., titanium carbide (TiC), titanium aluminum carbide (TiAlC), tantalum carbide (TaC) and/or hafnium carbide (HfC)). In some embodiments, a conductive material or a combination of multiple conductive materials can serve as both gate conductor and workfunction metal. The gate conductor 808 can be deposited by any suitable process or combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc. According to an exemplary embodiment, the gate conductor 808 has a thickness of from about 5 nm to about 20 nm and ranges therebetween.

Suitable gate dielectrics include, but are not limited to, silicon oxide (SiOx), silicon nitride (SiN), silicon oxynitride (SiOxNy) and/or high-κ materials. The term "high-κ" as used herein refers to a material having a relative dielectric constant κ which is much higher than that of silicon dioxide (e.g., a dielectric constant κ is about 25 for hafnium oxide ($HfO_2$) rather than 3.9 for $SiO_2$). Suitable high-r materials include, but are not limited to, metal oxides such as hafnium oxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium oxide ($ZrO_2$), zirconium silicon oxide ($ZrSiO_4$), zirconium silicon oxynitride (ZrSiOxNy), tantalum oxide (TaOx), titanium oxide (TiO), barium strontium titanium oxide ($BaO_6SrTi_2$), barium titanium oxide ($BaTiO_3$), strontium titanium oxide ($SrTiO_3$), yttrium oxide ($Y_2O_3$), aluminum oxide ($Al_2O_3$), lead scandium tantalum oxide ($Pb(Sc,Ta)O_3$), and/or lead zinc niobite (Pb(Zn,Nb)O). The high-κ material can further include dopants such as lanthanum (La), aluminum (Al) and/or magnesium (Mg). The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. According to an exemplary embodiment, the gate dielectric 806 has a thickness of from about 1 nm to about 5 nm and ranges therebetween, although less thicknesses and greater thicknesses are also conceived.

Figure 9:
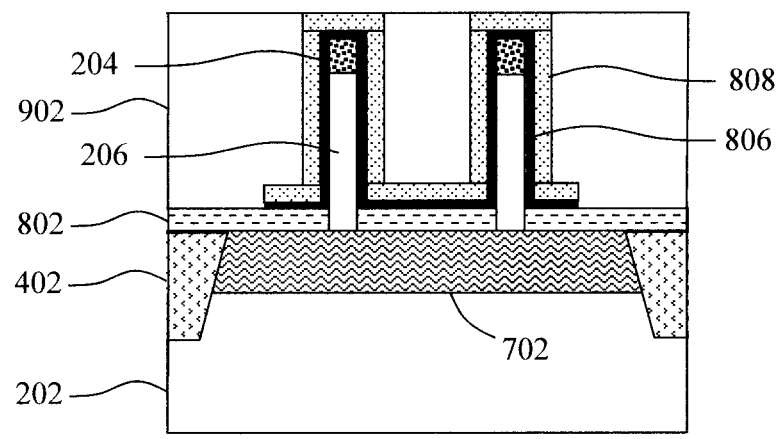
FIG. 9 is a cross-sectional diagram illustrating the gates having been buried in a first interlayer dielectric (ILD) according to an embodiment of the present invention.
Figure 10:
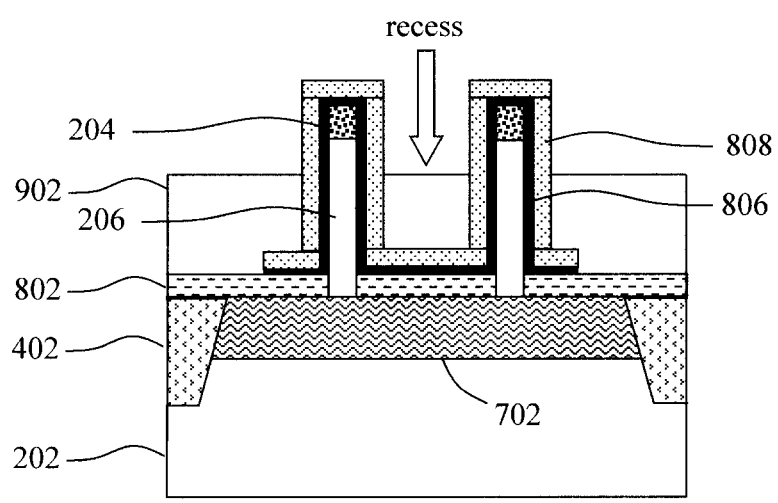
FIG. 10 is a cross-sectional diagram illustrating the first ILD having been recessed such that the top surface of the first ILD is below the tops of the fins according to an embodiment of the present invention.
Figure 11:
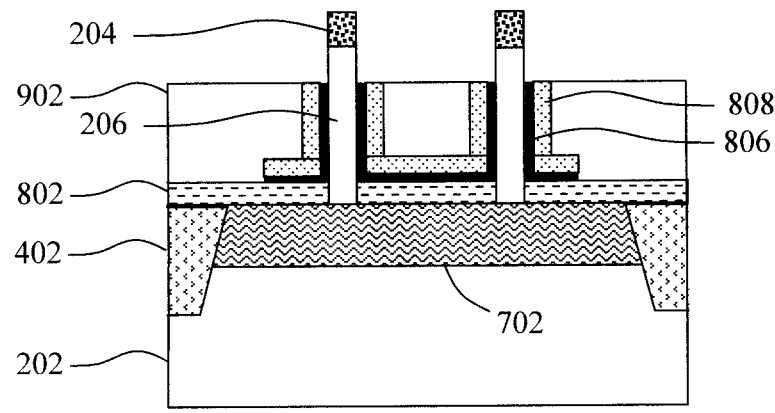
FIG. 11 is a cross-sectional diagram illustrating the gates having been recessed to the level of the recessed first ILD according to an embodiment of the present invention.
Figure 12:
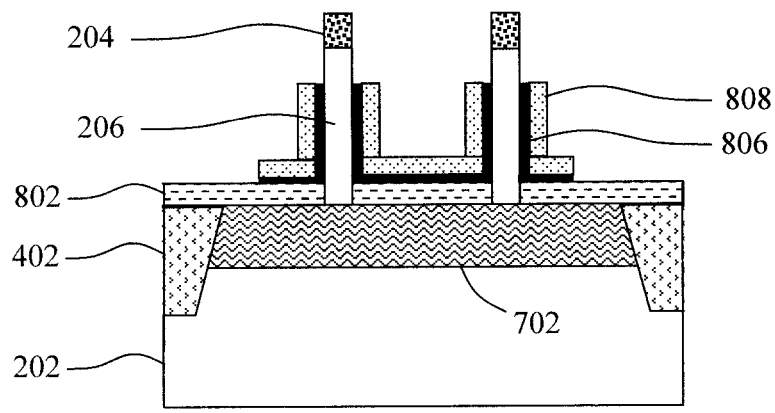
FIG. 12 is a cross-sectional diagram illustrating the remaining first ILD having been removed according to an embodiment of the present invention.

As deposited, the gate dielectric 806 and gate conductor 808 at present encapsulate the fins 206. However, in order to access the tops of the fins 206 to form the top spacers and the top source and drains, the gate dielectric 806 and gate conductor 808 have to be recessed at the tops of the fins 206. To do so, fins 206, gate dielectric 806 and gate conductor 808 are next buried in an interlayer dielectric (ILD) 902 such as SiOx and/or an organic planarizing layer (OPL) material. See FIG. 9. As shown in FIG. 9, the gate region has also been patterned to cut off the gate dielectric 806 and gate conductor 808 from two sides of the fins 206. A process such as CMP is then used to polish the deposited ILD 902 down to the gate conductor 808.

Use of ILD 902 enables selective exposure of tops of the fins 206. Namely, ILD 902 is next recessed such that the top surface of the ILD 902 is below the tops of the fins 206. See FIG. 10. This recess of the ILD 902 sets the depth for the recess of the gate dielectric 806 and gate conductor 808.

The gate dielectric 806 and gate conductor 808 are then recessed to the level of the recessed ILD 902. See FIG. 11. The tops of the fins 206 are now exposed. Following recess of the gate dielectric 806 and gate conductor 808, the remaining ILD 902 is removed. See FIG. 12.

Figure 13:
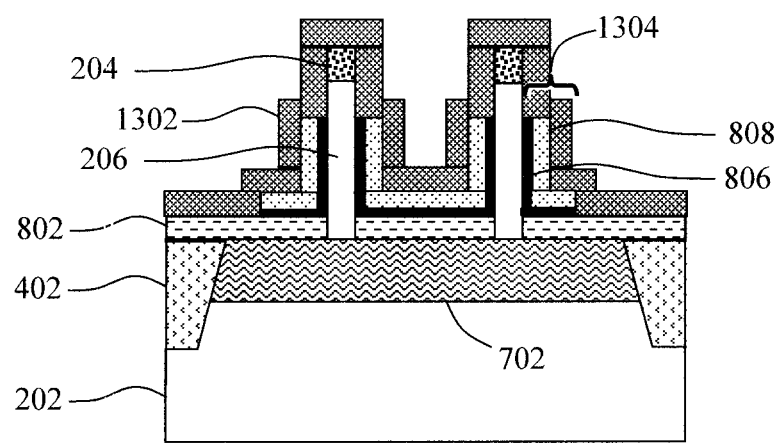
FIG. 13 is a cross-sectional diagram illustrating a liner having been deposited onto the fins and gates, forming top spacers over the gates according to an embodiment of the present invention.
Figure 14:
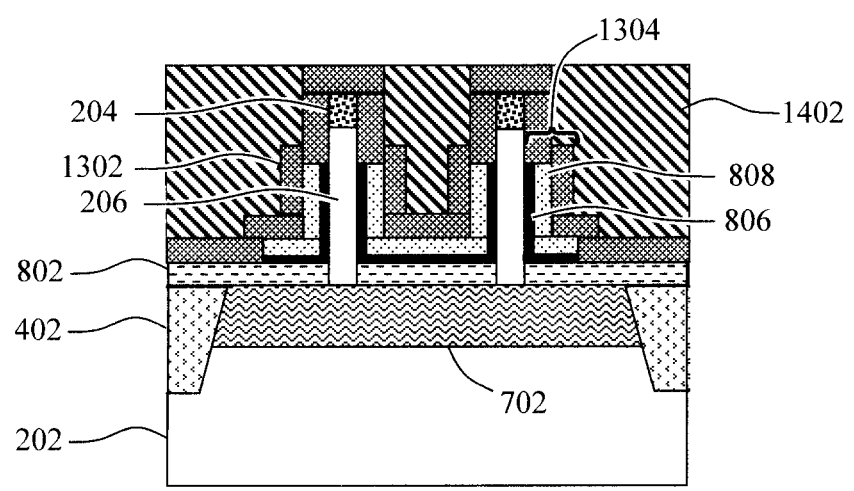
FIG. 14 is a cross-sectional diagram illustrating a second ILD having been blanket deposited over the liner, filling the spaces in between the fins according to an embodiment of the present invention.

Bottom spacers 802 separate the gates from the bottom source and drains 702. Counterpart top spacers are also needed above the gates to separate the gates from the top source and drains. To form the top spacers, a conformal liner 1302 is deposited (e.g., by CVD, ALD or PVD) onto the fins 206 and gate conductor 808. See FIG. 13. As shown in FIG. 13, deposition of liner 1302 provides top spacers 1304 over the gates. The top spacers 1304 and the counterpart bottom spacers 802 serve to offset the gate from the top and bottom source and drains, respectively.

Suitable materials for liner 1302 include, but are not limited to, nitride materials such as silicon nitride (SiN), silicon boron carbon nitride (SiBCN), silicon oxycarbon nitride (SiOCN), and/or silicon carbon nitride (SiCN). According to an exemplary embodiment, the liner 1302/top spacers 1304 and the bottom spacers 802 are both formed from the same material, e.g., SiN, SiBCN, SiOCN and/or SiCN.

Figure 15:
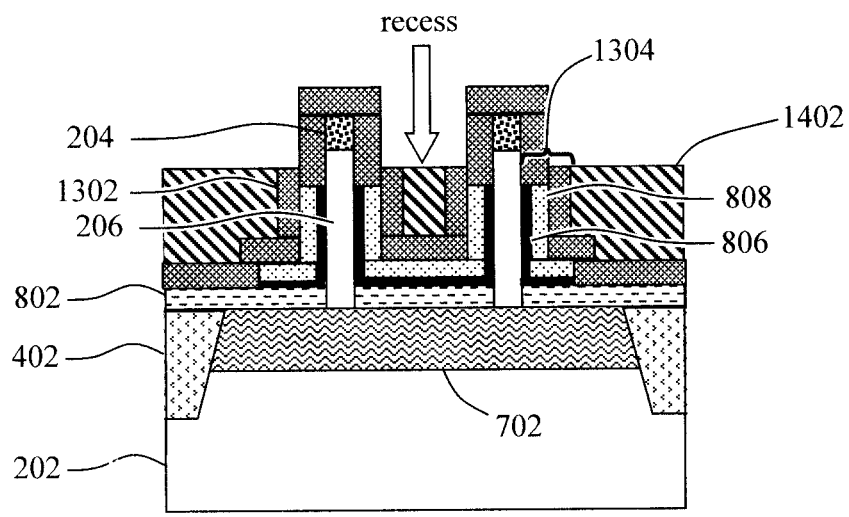
FIG. 15 is a cross-sectional diagram illustrating a recess etch of the second ILD having been performed such that the top surface of the second ILD is recessed beneath the tops of the fins according to an embodiment of the present invention.

A (second) ILD 1402 (i.e., wherein ILD 902 is the first ILD) is then blanket deposited over the liner 1302, filling the spaces in between the fins 206. See FIG. 14. A process such as CMP is then used to polish the deposited ILD 1402 down to the liner 1302. As provided above, suitable ILD materials include, but are not limited to, SiOx and/or an OPL material. ILD 1402 enables selective removal of the fin hardmasks 204 and liner 1302 at the tops of the fins 206. Namely, as shown in FIG. 15, a recess etch of the ILD 1402 is next performed such that the top surface of the ILD 1402 is recessed beneath the tops of the fins 206.

Figure 16:
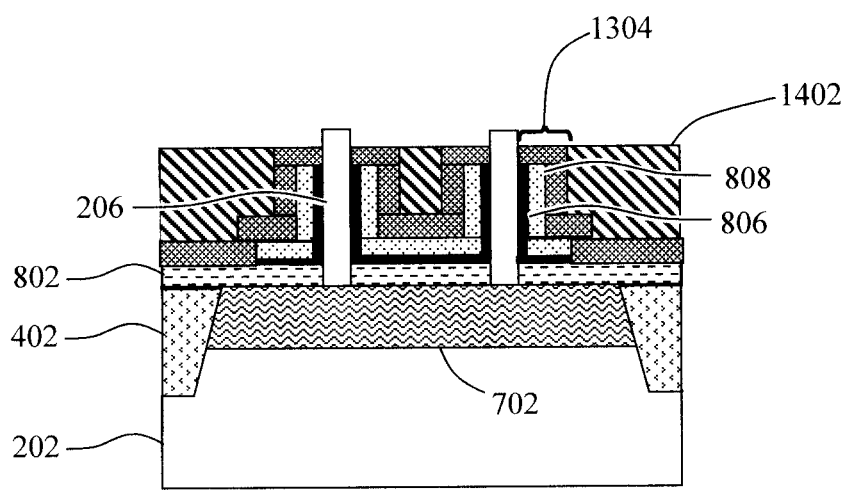
FIG. 16 is a cross-sectional diagram illustrating an etch having been used to recess the liner and remove the fin hardmasks from the tops of the fins according to an embodiment of the present invention.
Figure 17:
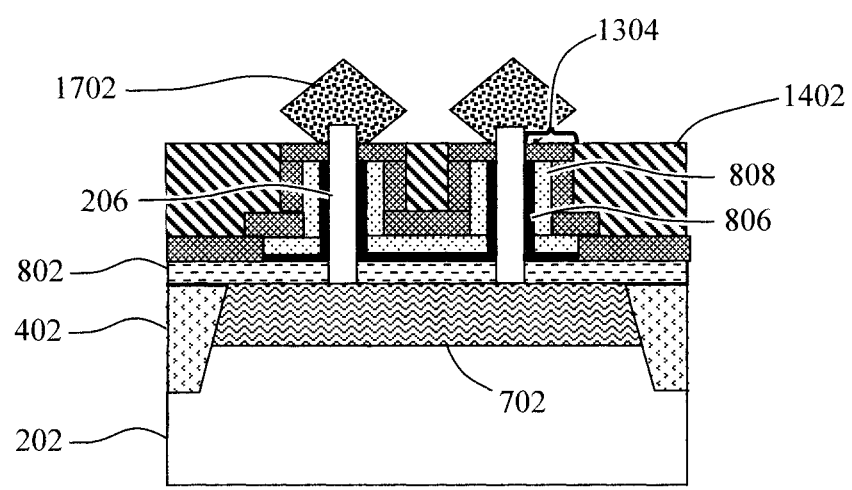
FIG. 17 is a cross-sectional diagram illustrating top source and drains having been formed on the exposed tops of the fins according to an embodiment of the present invention.

An etch is then used to recess the liner 1302 and remove the fin hardmasks 204 from the tops of the fins 206. See FIG. 16. This etch reveals the tops of the fins 206 in order to form the top source and drains. As provided above, the fin hardmasks 204 and the liner 1302 can both be formed from a nitride material. In that case, a nitride-selective etching process, such as a nitride-selective RIE can be employed to recess the liner 1302 and remove the fin hardmasks 104. As shown in FIG. 16, the top spacers 1304 remain present over the gates following the recess etch of the liner 1302.

Top source and drains 1702 are then formed on the exposed tops of the fins 206 (vertical fin channels). See FIG. 17. According to an exemplary embodiment, the top source and drains 1702 are formed from an in-situ (i.e., during growth) or ex-situ (e.g., via implantation) doped epitaxial material such as epitaxial Si, Ge, SiGe, etc. As provided above, suitable n-type dopants include, but are not limited to, phosphorous (P) and arsenic (As), and suitable p-type dopants include, but are not limited to, boron (B).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for dry etching, comprising the steps of:
contacting a wafer comprising an oxide with at least one etch gas under conditions sufficient to etch the oxide at a rate of less than about 30 angstroms (Å) per minute (min) (Å/min);
removing a byproduct of the etch from the wafer using a thermal treatment; and
repeating the contacting step followed by the removing step multiple times until a desired recess of the oxide has been achieved, wherein the method further comprises the steps of:
performing the contacting step in a first reaction chamber;
removing the wafer from the first reaction chamber; and
performing the step of removing the byproduct of the etch from the wafer in a second reaction chamber.

2. The method of claim 1, wherein the rate is from about 20 Å/min to about 25 Å/min and ranges therebetween.

3. The method of claim 1, wherein the at least one etch gas is selected from the group consisting of: ammonia ($NH_3$) gas, hydrogen fluoride (HF) gas, and combinations thereof.

4. The method of claim 3, wherein the at least one etch gas comprises a mixture of $NH_3$ gas and HF gas.

5. The method of claim 4, wherein the mixture comprises $NH_3$ gas and HF gas in a ratio of from about 1:1 to about 1:2.

6. The method of claim 1, wherein the at least one etch gas is present in a carrier gas.

7. The method of claim 6, wherein the carrier gas is selected from the group consisting of: argon (Ar) gas, nitrogen ($N_2$) gas, and combinations thereof.

8. The method of claim 6, wherein from about 30 standard cubic centimeters per minute (sccm) to about 50 sccm and ranges therebetween of the etch gas is present in from about 400 sccm to about 1000 sccm and ranges therebetween of the carrier gas.

9. The method of claim 1, wherein the conditions comprise a pressure of from about 30 millitorr (mTorr) to about 50 mTorr and ranges therebetween, a temperature of from about 30° C. to about 50° C. and ranges therebetween, and a duration of from about 50 seconds to about 1000 seconds and ranges therebetween.

10. The method of claim 1, wherein the thermal treatment is carried out at a temperature of from about 150° C. to about 200° C. and ranges therebetween, and a duration of from about 1 minute to about 5 minutes and ranges therebetween.

11. The method of claim 10, wherein the thermal treatment is carried out at a pressure of from about 500 mTorr to about 1000 mTorr and ranges therebetween.

12. A method of forming a vertical field effect transistor (VFET) device, the method comprising the steps of:
etching fins in a wafer using fin hardmasks, wherein the fins comprise vertical fin channels of the VFET device;
patterning at least one shallow trench isolation (STI) trench in the wafer adjacent to the fins;
burying the fins in an STI oxide;
recessing the STI oxide by i) contacting the wafer with at least one etch gas under conditions sufficient to etch the STI oxide at a rate of less than about 30 Å/min, ii) removing a byproduct of the etch from the wafer using a thermal treatment, and iii) repeating the contacting step followed by the removing step multiple times until a desired recess of the STI oxide has been achieved, wherein the step of recessing the STI oxide further comprises the steps of: performing the contacting step in a first reaction chamber; removing the wafer from the first reaction chamber; and performing the step of removing the byproduct of the etch from the wafer in a second reaction chamber;
forming bottom source and drains in the wafer at a base of the fins;
forming bottom spacers on the bottom source and drains;
forming gates around the fins above the bottom spacers;
forming top spacers over the gates; and
forming top source and drains at tops of the fins.

13. The method of claim 12, wherein the rate is from about 20 Å/min to about 25 Å/min and ranges therebetween.

14. The method of claim 12, wherein the at least one etch gas is selected from the group consisting of: ammonia ($NH_3$) gas, hydrogen fluoride (HF) gas, and combinations thereof.

15. The method of claim 12, wherein the at least one etch gas is present in a carrier gas selected from the group consisting of: Ar gas, $N_2$ gas, and combinations thereof.

16. The method of claim 15, wherein from about 30 sccm to about 50 sccm and ranges therebetween of the etch gas is present in from about 400 sccm to about 1000 sccm and ranges therebetween of the carrier gas.

17. The method of claim 12, wherein the conditions comprise a pressure of from about 30 millitorr (mTorr) to about 50 mTorr and ranges therebetween, a temperature of from about 30° C. to about 50° C. and ranges therebetween, and a duration of from about 50 seconds to about 1000 seconds and ranges therebetween.

18. The method of claim 12, wherein the thermal treatment is carried out at a temperature of from about 150° C. to about 200° C. and ranges therebetween, a duration of from about 1 minute to about 5 minutes and ranges therebetween, and a pressure of from about 500 mTorr to about 1000 mTorr and ranges therebetween.

* * * * *